(12) United States Patent
Nakatsu et al.

(10) Patent No.: US 7,564,255 B2
(45) Date of Patent: Jul. 21, 2009

(54) SEMICONDUCTOR INTEGRATED CIRCUIT FOR REDUCING NUMBER OF CONTACT PADS TO BE PROBED IN PROBE TEST

(75) Inventors: Shinichi Nakatsu, Kanagawa (JP); Hideo Isogai, Kanagawa (JP); Takehiro Masumoto, Kanagawa (JP); Kazuyuki Nishizawa, Kanagawa (JP); Toshihide Tsuboi, Kanagawa (JP); Kimiharu Etou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 29 days.

(21) Appl. No.: 11/355,958

(22) Filed: Feb. 17, 2006

(65) Prior Publication Data

US 2006/0190779 A1   Aug. 24, 2006

(30) Foreign Application Priority Data

Feb. 21, 2005   (JP)  ............................. 2005-044004

(51) Int. Cl.
   *G01R 31/28*   (2006.01)
(52) U.S. Cl. ...................................... 324/765; 324/158.1

(58) Field of Classification Search .................. None
   See application file for complete search history.

(56) References Cited

U.S. PATENT DOCUMENTS

| 5,175,494 | A  | * | 12/1992 | Yoshimori | .................. | 714/728 |
| 6,456,099 | B1 | * | 9/2002 | Eldridge et al. | ............. | 324/754 |
| 6,849,956 | B2 |   | 2/2005 | Shigihara | | |
| 7,202,692 | B2 | * | 4/2007 | Miyano | ..................... | 324/765 |

FOREIGN PATENT DOCUMENTS

| JP | 2001-77162 | 3/2001 |
| JP | 2003-332450 | 11/2003 |

* cited by examiner

*Primary Examiner*—Paresh Patel
(74) *Attorney, Agent, or Firm*—Foley & Lardner LLP

(57) ABSTRACT

A semiconductor chip is composed of first and second contact pads; a first latch circuit connected with the first contact pad; a second latch circuit connected with the second contact pads; an internal circuit electrically connected with the first and second latch circuits; and a control circuit controlling data transfer between the first and second latch circuits. The area of the first contact pad is larger than that of the second contact pad.

10 Claims, 3 Drawing Sheets

SEMICONDUCTOR INTEGRATED CIRCUIT FOR REDUCING NUMBER OF CONTACT PADS TO BE PROBED IN PROBE TEST

BACKGROUND OF THE INVENTION

1. Field of the Invention

The present invention relates to semiconductor integrated circuit, in particular, relates to a probe test technique for semiconductor integrated circuits.

2. Description of the Related Art

As known in the art, a large number of semiconductor chips, each designed to provide desired functions, are integrated within a semiconductor wafer in the semiconductor manufacture process. The semiconductor chips on the semiconductor wafer are tested before the dicing, which involves cutting the semiconductor wafer into the semiconductor chips. The test of the semiconductor chips is achieved by a tester and a probe card provided with test probes. Such test is often referred to as the probe test.

When a probe test is performed, test probes are placed on associated pads of semiconductor chips to provide electrical connections between the semiconductor chips and the tester. The test probes are required to be in contact with the associated pads at the same time. The probe test time is increased as the number of the semiconductor chips integrated within the semiconductor wafer is increased.

Japanese Laid Open Patent Application No. JP-A 2003-332450 discloses a semiconductor device structure for increasing the density of contact pads integrated on the semiconductor chip. In the disclosed semiconductor device structure, contact pads having different sizes are alternately arranged in line. The larger contact pads are used to be probed by test probes, and also used to be wire-bonded. The smaller pads, on the other hand, are dedicated to be wire-bonded. The semiconductor device includes first and second internal circuits, and the larger contact pads are connected with selected ones of the first and second internal circuits through switches. Additionally, the smaller contact pads are directly connected with the second internal circuits. When a probe test is performed, test probes are placed on the larger contact pads, and signals are firstly fed to the first internal circuits through the larger pads and the switches. This is followed by electrically connecting the larger contact pads with the second internal circuits, and then feeding signals to the second internal circuits. The electrical connections between the larger pads and the first and second internal circuits are controlled by a switch control circuit integrated within the semiconductor device.

Japanese Laid Open Patent Application No. 2001-77162 discloses a technique for reducing the probe test time. In the disclosed technique, a probe test is performed on multiple lines of the semiconductor chips at the same time. This application discloses that the semiconductor chips each includes a line of contact pads, and test probes are arranged in two lines on a probe card which is adapted to the parallel probe test. Such parallel probe test effectively reduces the probe test time.

However, the above-described conventional arts suffer from drawbacks as follows. The semiconductor device structure disclosed in Japanese Laid Open Patent Application No. JP-A 2003-332450 requires separately testing the first and second internal circuits. In this semiconductor device structure, for example, the test of the first internal circuits is firstly performed, and then the test of the second internal circuits is performed after the test of the first internal circuits is completed. This undesirable increases the probe test time.

The technique disclosed in the Japanese Laid Open Patent Application No. 2001-77162, on the other hand, requires all the contact pads to be probed by the testing probes, resulting in the increase in the number of the contact pads to be probed. Additionally, this technique is not adapted to a pad arrangement in which contact pads are arranged in both of horizontal and vertical directions, imposing restrictions on the pad arrangement. Such restrictions may make it difficult to design semiconductor chip.

SUMMARY OF THE INVENTION

In an aspect of the present invention, a semiconductor chip is composed of first and second contact pads; a first latch circuit connected with the first contact pad; a second latch circuit connected with the second contact pads; an internal circuit electrically connected with the first and second latch circuits; and a control circuit controlling data transfer between the first and second latch circuits. The area of the first contact pad is larger than that of the second contact pad.

In the semiconductor chip thus designed, test data can be transferred to both of the first and second latch circuits through only the first contact pad, which is suitable for probing. This eliminates the need for probing the second contact pad during the probe test, and allows performing the probe test with a reduced number of contact pads probed with test probes.

In another aspect of the present invention, a semiconductor chip is composed of first and second contact pads; a first latch circuit connected with the first contact pad; a second latch circuit connected with the second contact pads; an internal circuit electrically connected with the first and second latch circuits; and a control circuit controlling data transfer between the first and second latch circuits. The first contact pad has a trace of a probe.

In still another aspect of the present invention, a semiconductor chip is composed of first and second contact pads; a first latch circuit connected with the first contact pad; a second latch circuit connected with the second contact pads; an internal circuit electrically connected with the first and second latch circuits; and a control circuit controlling data transfer between the first and second latch circuits. The internal circuit is responsive to external data received by the first contact pad to output internal circuit output data. The second latch circuit latches the internal circuit output data. The control circuit controls the first and second latch circuit to transfer the internal circuit output data from the second latch circuit to the first latch circuit.

In still another aspect of the present invention, a semiconductor chip is composed of a first contact pad to be probed; a second contact pad not to be probed; a first latch circuit connected with the first contact pad; a second latch circuit connected with the second contact pads; an internal circuit configured to output first and second output data to the first and second latch circuits, respectively; and a control circuit connected with the first and second latch circuits. The first latch circuit is configured to feed the first output data to the first contact pad. The control circuit is responsive to a control signal for controlling the first and second latch circuit, and thereby achieves transferring the second output data from the second latch circuit to the first latch circuit, and feeding the second output data to the first contact pad.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Figure 1:
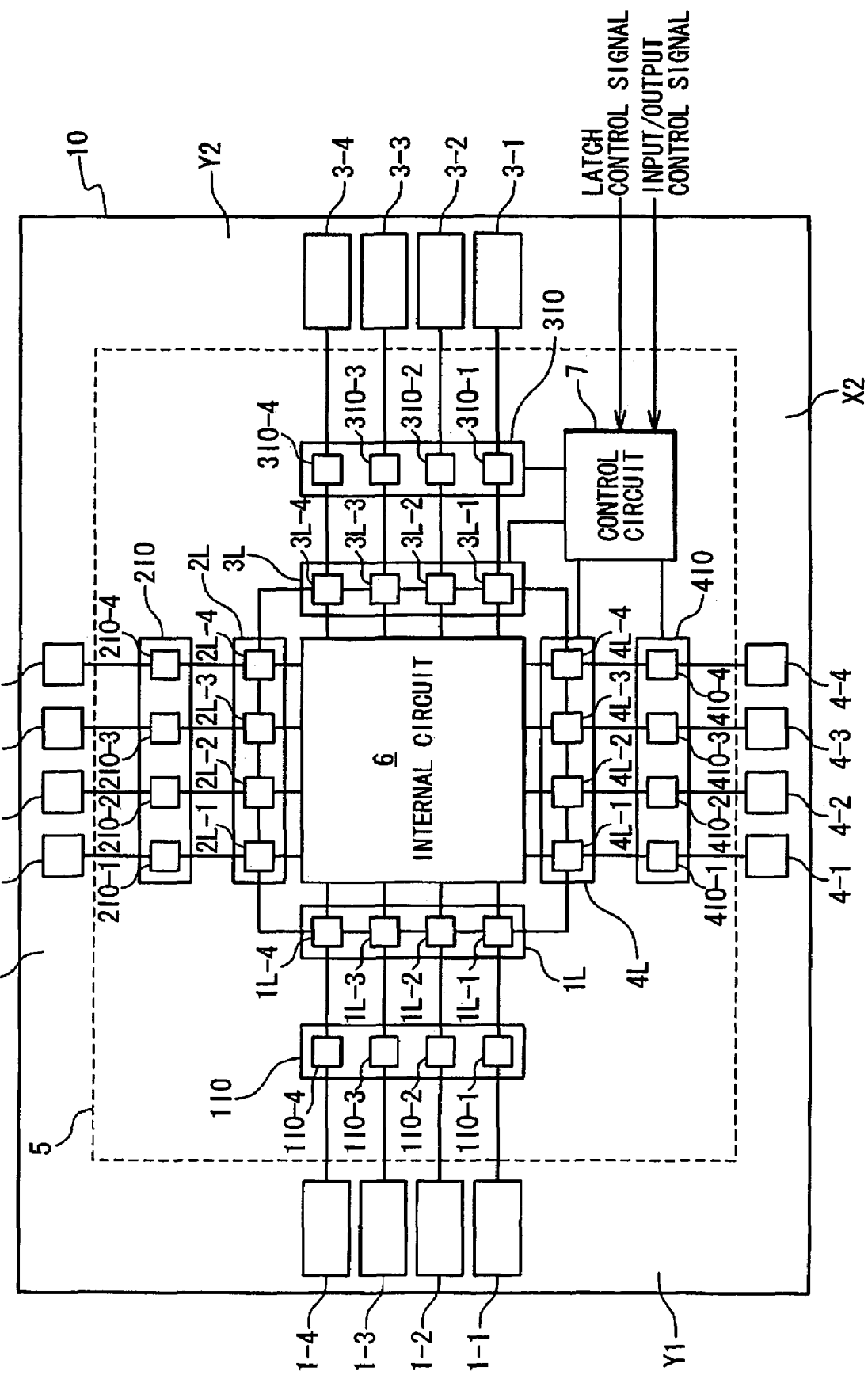
FIG. 1 is a block diagram illustrating an exemplary structure of a semiconductor device according to the present invention.

FIG. 1 is a block diagram illustrating an exemplary structure of a semiconductor chip 10 in one embodiment of the present invention. It is understood that a large number of the semiconductor chips 10 shown in FIG. 1 are integrated within a semiconductor wafer.

The semiconductor chip 10 is composed of a functioning circuitry 5 designed to provide desired functions, and a plurality of contact pads, including first pads 1-1 to 1-4, second pads 2-1 to 2-4, third pads 3-1 to 3-4 and fourth pads 4-1 to 4-4.

The first pads 1-1 to 1-4 and the third pads 3-1 to 3-4 are arranged along opposing edges of the semiconductor chip 10. In detail, the first pads 1-1 to 1-4 are arranged along an edge Y1 of the semiconductor chip 10, and the third pads 3-1 to 3-4 are arranged along another edge Y2 opposed to the edge Y1.

The second pads 2-1 to 2-4 and the fourth pads 4-1 to 4-4 are arranged along other two opposing edges of the semiconductor chip 10. In detail, the second pads 2-1 to 2-4 are arranged along an edge X1 of the semiconductor chip 10, the edge X1 being orthogonal to the edges Y1 and Y2. The fourth pads 4-1 to 4-4 are arranged along another edge X2 opposed to the edge X1.

The first pads 1-1 to 1-4 and the third pads 3-1 to 3-4 are designed to be probed by test probes, having larger areas than those of the second pads 2-1 to 2-4 and the fourth pads 4-1 to 4-4. In one embodiment, the second pads 2-1 to 2-4 and the fourth pads 4-1 to 4-4 are square in shape, while the first pads 1-1 to 1-4 and the third pads 3-1 to 3-4 are rectangular in shape. The first pads 1-1 to 1-4 and the third pads 3-1 to 3-4 are used to be wire-bonded as well as to be probed by test probes. In one embodiment, the first pads 1-1 to 1-4 and the third pads 3-1 to 3-4 each include a probing region to be probed, and a bonding region to be wire-bonded after the probe test. The second pads 2-1 to 2-4 and the fourth pads 4-1 to 4-4, having relatively small areas, are only used to be wire-bonded.

The functioning circuitry 5 includes an internal circuit 6 that performs various desired operations. The internal circuit 6 is formed at the center portion of the semiconductor chip 10.

The functioning circuitry 5 further includes a plurality of latch circuitries: first to fourth latch circuitries 1L, 2L, 3L, and 4L. The first latch circuitry 1L is composed of a set of latch circuits 1L-1 to 1L-4, and the second latch circuitry 2L is composed of a set of latch circuits 2L-1 to 2L-4. Correspondingly, the third latch circuitry 3L is composed of a set of latch circuits 3L-1 to 3L-4, and the fourth latch circuitry 4L is composed of a set of latch circuits 4L-1 to 4L-4. The first to fourth latch circuitries 1L to 4L each function as serial/parallel input and output shift registers, and provides a scan path for testing the semiconductor chip 10.

The set of the first latch circuits 1L-1 to 1L-4 are connected between the internal circuit 6 and the first contact pads 1-1 to 1-4, and the set of the second latch circuits 2L-1 to 2L-4 are connected between the internal circuit 6 and the second contact pads 2-1 to 2-4. Correspondingly, the set of the third latch circuits 3L-1 to 3L-4 are connected between the internal circuit 6 and the third contact pads 3-1 to 3-4, and the set of the fourth latch circuits 4L-1 to 4L-4 are connected between the internal circuit 6 and the fourth contact pads 4-1 to 4-4.

The functioning circuitry 5 further includes first to fourth input/output circuitries 1IO to 4IO. The first input/output circuitry 1IO is composed of a set of first I/O circuit 1IO-1 to 1IO-4, and the second input/output circuitry 2IO is composed of a set of second I/O circuit 2IO-1 to 2IO-4. Correspondingly, the third input/output circuitry 3IO is composed of a set of third I/O circuit 3IO-1 to 3IO-4, and the fourth input/output circuitry 4IO is composed of a set of fourth I/O circuit 4IO-1 to 4IO-4.

The first I/O circuits 1IO-1 to 1IO-4 are connected between the first pads 1-1 to 1-4 and the first latch circuits 1L-1 to 1L-4, respectively. Correspondingly, the second I/O circuits 2IO-1 to 2IO-4 are connected between the second pads 2-1 to 2-4 and the second latch circuits 2L-1 to 2L-4, respectively. The third I/O circuits 3IO-1 to 3IO-4 are connected between the third pads 3-1 to 3-4 and the third latch circuits 3L-1 to 3L-4, respectively, and finally, the fourth I/O circuits 4IO-1 to 4IO-4 are connected between the fourth pads 4-1 to 4-4 and the fourth latch circuits 4L-1 to 4L-4, respectively.

The functioning circuitry 5 additionally includes a control circuit 7 connected with the first to fourth latch circuits 1L-1 to 1L-4, 2L-1 to 2L-4, 3L-1 to 3L-4, and 4L-1 to 4L-4, and the first to fourth I/O circuits 1IO-1 to 1IO-4, 2IO-1 to 2IO-4, 3IO-1 to 3IO-4, and 4IO-1 to 4IO-4. The control circuit 7 is responsive to an external latch control signal to control latch operations of the first to fourth latch circuits 1L-1 to 1L-4, 2L-1 to 2L-4, 3L-1 to 3L-4, and 4L-1 to 4L-4. Additionally, the control circuit 7 is responsive to an externally-provided input/output control signal to control input-output operations of the first to fourth I/O circuits 1IO-1 to 1IO-4, 2IO-1 to 2IO-4, 3IO-1 to 3IO-4, and 4IO-1 to 4IO-4.

Figure 2:
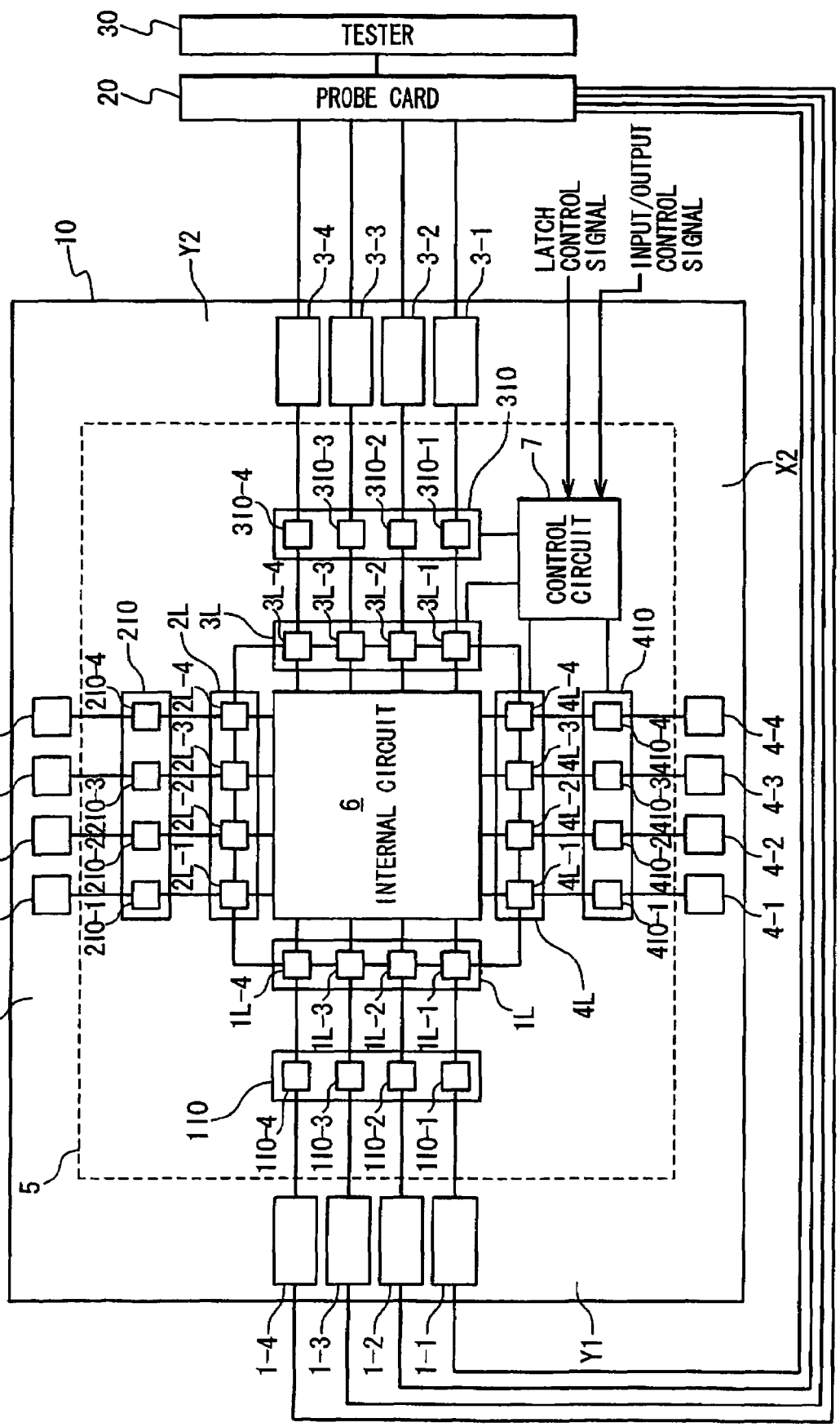
FIG. 2 is a block diagram illustrating an exemplary method of performing a probe test of the semiconductor device shown in FIG. 1.

The semiconductor chip 10 is designed so that electrical properties of the functioning circuitry 5 are probe-tested before the dicing. In this embodiment, as shown in FIG. 2, the probe test is performed by a tester 30 through a probe card 20, probing the first pads 1-1 to 1-4 and the third pads 3-1 to 3-4 by test probes provided on the probe card 20.

Figure 3:
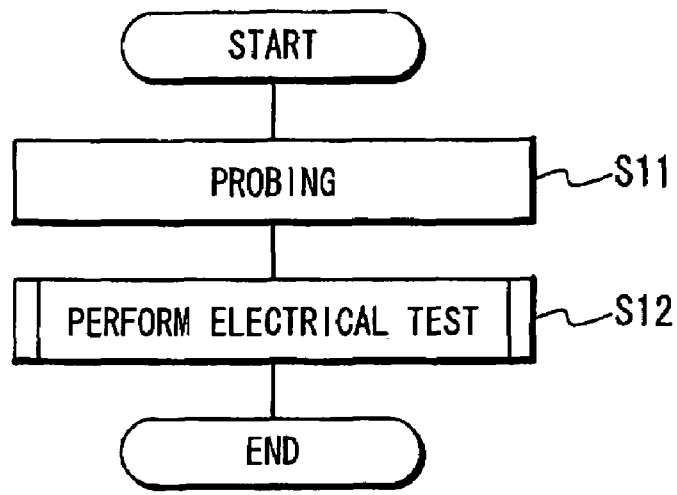
FIG. 3 is a flowchart illustrating an exemplary procedure of the probe test.

FIG. 3 is a flowchart of a probe test performed in a semiconductor manufacture process of the semiconductor chip 10 in this embodiment. The probe test involves probing (at Step S11) and performing electrical test (at Step S12).

At Step S11, the first pads 1-1 to 1-4 and the third pads 3-1 to 3-4 are probed by the test probes provided on the probe card 20. In one embodiment, the test probes are placed on the probing regions of the respective first pads 1-1 to 1-4 and the third pads 3-1 to 3-4. It should be noted that only the first pads 1-1 to 1-4 and the third pads 3-1 to 3-4, which have relatively large areas, are probed with the test probes; the second pads 2-1 to 2-4 and the fourth pads 4-1 to 4-4 are not probed by test probes. This implies that the first pads 1-1 to 1-4 and the third pads 3-1 to 3-4 exhibit traces of the test probes after the probe test, while the second pads 2-1 to 2-4 and the fourth pads 4-1 to 4-4 are free from traces of the test probes. The rectangular shapes of the first pads 1-1 to 1-4 and the third pads 3-1 to 3-4, larger than those of the second pads 2-1 to 2-4 and the fourth pads 4-1 to 4-4, indicate that the test probes are to be placed on the first pads 1-1 to 1-4 and the third pads 3-1 to 3-4.

Figure 4:
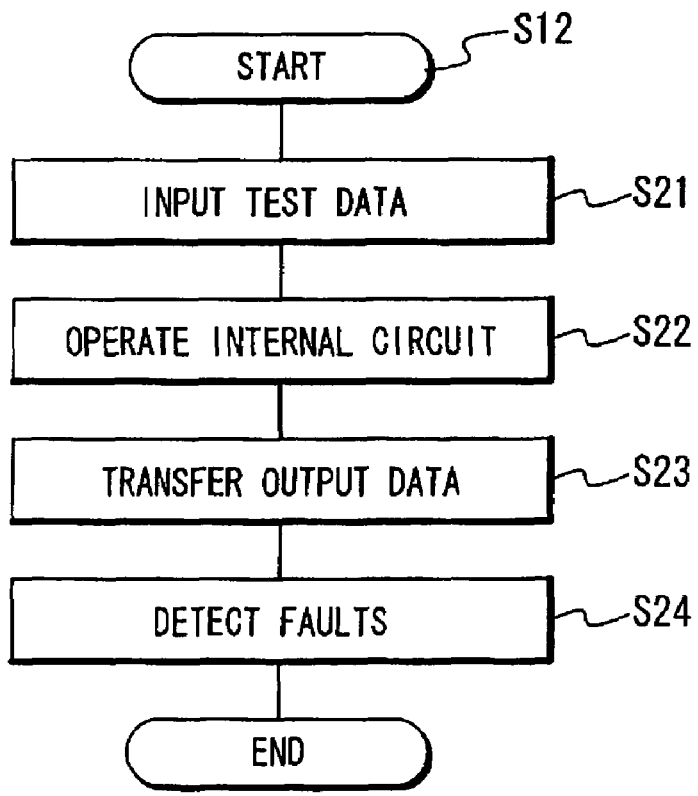
FIG. 4 is a flowchart illustrating an exemplary procedure of testing of electrical properties of the semiconductor device.

At Step S12, an electrical test is performed on the functioning circuitry 5 by the tester 30 through the probe card 20. FIG. 4 illustrates an exemplary procedure of the electrical test at Step S12. In one embodiment, the electrical test at Step S12 involves inputting test data at Step S21, operating the internal circuit 6 at Step S22, transferring output data at Step S23, and detecting faults at Step S24.

At Step S21, test data are inputted to the semiconductor chip 10. Firstly, the semiconductor chip 10 is placed into an operation mode in which the semiconductor chip 10 is adapted to transfer data externally received by the first pads 1-1 to 1-4 to the internal circuit 6, and to transfer output data from the internal circuit 6 to the third pads 3-1 to 3-4. In detail, the control circuit 7 activates the first I/O circuits 1IO-1 to 1IO-4 and the third I/O circuits 3IO-1 to 3IO-4 in response to the externally received input/output control signal, and allows the first I/O circuits 1IO-1 to 1IO-4 to function as input buffers that transfer data from the first pads 1-1 to 1-4 to the first latch circuits 1L-1 to 1L-4, while allowing the third I/O circuits 3IO-1 to 3IO-4 to function as output buffers that transfer data from the third latch circuits 3L-1 to 3L-4 to the third pads 3-1 to 3-4. The control circuit 7 deactivates the second I/O circuits 2IO-1 to 2IO-4 and the fourth I/O circuits 4IO-1 to 4IO-4 so that the transferred data are free from noise that may be cause by the second I/O circuits 2IO-1 to 2IO-4 and the fourth I/O circuits 4IO-1 to 4IO-4; it should be noted that the second pads 2-1 to 2-4 and the fourth 4-1 to 4-4 are not probed, and therefore the second I/O circuits 2IO-1 to 2IO-4 and the fourth I/O circuits 4IO-1 to 4IO-4 are not used in the probe test.

This is followed by feeding first data, which is used as the test data, to the first pads 1-1 to 1-4 by the tester 30 through the probe card 20. The first I/O circuits 1IO-1 to 1IO-4 transfers the first data received by the first pads 1-1 to 1-4 to the first latch circuits 1L-1 to 1L-4. The control circuit 7 allows the first latch circuits 1L-1 to 1L-4 to latch the first data from the first I/O circuits 1IO-1 to 1IO-4, and to output the first data to the internal circuit 6.

At Step S22, the internal circuit 6 operates in response to the first data (that is, the test data) to generate output data including second to fourth data. The second, third, and fourth data are associated with the second, third, and fourth pads 2-1 to 2-4, 3-1 to 3-4, and 4-1 to 4-4, respectively, and outputted to the second latch circuits 2L-1 to 2L-4, the third latch circuits 3L-1 to 3L-4, and the fourth latch circuits 4L-1 to 4L-4, respectively. The second latch circuits 2L-1 to 2L-4 latch the second data, and the third latch circuits 3L-1 to 3 L-4 latch the third data, and the fourth latch circuits 4L-1 to 4L-4 latch the fourth data.

The third I/O circuits 3IO-1 to 3IO-4 transfer the third data latched by the third latch circuits 3L-1 to 3L-4 to the third pads 3-1 to 3-4. The third data are then transferred from the third pads 3-1 to 3-4 to the tester 30 through the probe card 20. The tester 30 uses the third data transferred thereto as a part of the output data associated with the test data (or the first data).

This is followed by transferring the second and fourth data to the third latch circuits 3L-1 to 3L-4 and the first latch circuits 1L-1 to 1L-4, respectively. Firstly, the semiconductor chip 10 is placed into another operation mode in which the semiconductor chip 10 is adapted to transfer data from the first latch circuits 1L-1 to 1L-4 to the first pads 1-1 to 1-4, and to transfer data from the third latch circuits 3L-1 to 3L-4 to the third pads 3-1 to 3-4. In detail, the control circuit 7 activates the first I/O circuits 1IO-1 to 1IO-4 and the third I/O circuits 3IO-1 to 3IO-4 in response to the externally received input/output control signal, and allows the first I/O circuits 1IO-1 to 1IO-4 to function as output buffers that transfer data from the first latch circuits 1L-1 to 1L-4 to the first pads 1-1 to 1-4, while allowing the third I/O circuits 3IO-1 to 3IO-4 to function as output buffers that transfer data from the third latch circuits 3L-1 to 3L-4 to the third pads 3-1 to 3-4.

The control circuit 7 then allows the first to fourth latch circuitries 1L to 4L to operate as serially-connected shift registers, in response to the externally-provided latch control signal. In detail, the control circuit 7 allows the second, third, and fourth latch circuits 2L-1 to 2L-4, 3L-1 to 3L-4, and 4L-1 to 4L-4 to transfer the second, third and fourth data, which are the output data from the internal circuit 6, to the third, fourth, and first latch circuits 3L-1 to 3L-4, 4L-1 to 4L-4, and 1L-1 to 1L-4, respectively. In this embodiment, the second, third and fourth data are transferred from the second, third, and fourth latch circuits 2L-1 to 2L-4, 3L-1 to 3L-4, and 4L-1 to 4L-4 to the third, fourth and first latch circuits 3L-1 to 3L-4, 4L-1 to 4L-4, and 1L-1 to 1L-4, in response to a clock signal being activated four times.

Upon the data transfer of the second data to the third latch circuits 3L-1 to 3L-4, the third I/O circuits 3IO-1 to 3IO-4 transfer the second data to the third pads 3-1 to 3-4. The second data received by the third pads 3-1 to 3-4 are then provided to the tester 30 through the probe card 20. The tester 30 uses the second data transferred thereto as a part of the output data associated with the test data (or the first data).

Correspondingly, the first I/O circuits 3IO-1 to 1IO-4 transfer the fourth data to the first pads 1-1 to 1-4, upon the data transfer of the fourth data to the first latch circuits 1L-1 to 1L-4. The fourth data received by the first pads 1-1 to 1-4 are then provided to the tester 30 through the probe card 20. The tester 30 uses the fourth data transferred thereto as a part of the output data associated with the test data (or the first data)

This is followed by detecting faults in the semiconductor chip 10. The tester 30 detects faults in the semiconductor chip 10, referring to the output data associated with the test data (that is, second to fourth data received from the internal circuit 6). When the semiconductor chip 10 is judged as good, the semiconductor chip 10 is assembled into a package after the contact pads on the semiconductor chip 10 are wire-bonded. After the semiconductor chip 10 is assembled, input/output signals are interfaced through all of the first pads 1-1 to 1-4, second pads 2-1 to 2-4, third pads 3-1 to 3-4 and fourth pads 4-1 to 4-4.

As thus described, the semiconductor chip 10 in this embodiment, which is adapted to data transfer from the second and fourth latch circuits 2L-1 to 2L-4 and 4L-1 to 4L-4 to the third and first latch circuits 3L-1 to 3L-4 and 1L-1 to 1L-4, achieves a probe test with a reduced number of contact pads probed by test probes. In the semiconductor chip 10 in this embodiment, the test data (or the first data) are fed to the internal circuit 6 through the first pads 1-1 to 1-4. As for the output data from the internal circuit 6, the third data are directly outputted from the third latch circuits 3L-1 to 3L-4, while the second and fourth data are transferred from the second and fourth latch circuits 2L-1 to 2L-4 and 4L-1 to 4L-4 to the third and first latch circuits 3L-1 to 3L-4 and 1L-1 to 1L-4, and then outputted from the third and first latch circuits 3L-1 to 3L-4 and 1L-1 to 1L-4 through the third and first pads 3-1 to 3-4 and 1-1 to 1-4. This allows the tester 30 to receive the output data, including the second to fourth data, only through the first and third 1-1 to 1-4 and 3-1 to 3-4, and to perform the electrical test on the semiconductor chip 10.

The above-described structure of the semiconductor chip 10 is also advantageous for performing a parallel probe test on multiple semiconductor chips at the same time. The semiconductor chip 10 is probe-testable only with the first and third pads 1-1 to 1-4 which are arranged in two lines along a certain direction; the second and fourth pads 2-1 to 2-4 and 4-1 to 4-4, arranged along the perpendicular direction, are not used for the probe test. This allows the test probes to be arranged in multiple parallel lines on the probe card 20, and facilitates the design of the probe card 20 adapted to the parallel probe test. Performing the parallel probe test is advantages for reducing the probe test time per chip.

Additionally, the pad arrangement in which the first and third pads 1-1 to 1-4 and 3-1 to 3-4 have larger areas than those of the second and fourth pads 2-1 to 2-4 and 4-1 to 4-4 allows separately providing the probing region and the bonding region for each of the first and third pads 1-1 to 1-4 and 3-1 to 3-4, and thereby effectively reduces wire bonding failures. When the probe test is performed, the first and third pads 1-1 to 1-4 and 3-1 to 3-4 are proved by the test probes on the probing regions; the bonding regions are free from traces of the test probes. This effectively reduces wire bonding failures when the first and third pads 1-1 to 1-4 and 3-1 to 3-4 are wire-bonded in the assembly process.

It is apparent that the present invention is not limited to the above-described embodiments, which may be modified and changed without departing from the scope of the invention.

Especially, it should be noted that, although the test data is directly inputted from the first latch circuits 1L-1 to 1L-4 to the internal circuit 6 in the above-described embodiment, the test data (that is, the first data) may be transferred from the first latch circuits 1L-1 to 1L-4 and to second latch circuits 2L-1 to 2L-4, and then inputted to the internal circuit 6 from the second latch circuits 2L-1 to 2L-4.

What is claimed is:

1. A semiconductor chip comprising:
   a plurality of contact pads;
   a plurality of latch circuits connected with said plurality of contact pads, respectively;
   an internal circuit electrically connected with said plurality of latch circuits; and
   a control circuit,
   wherein said plurality of latch circuits are serially connected to form a ring shift register,
   wherein said plurality of contact pads include;
   first contact pads; and
   second contact pads,
   wherein an area of said first contact pads is larger than that of said second contact pads, and
   wherein said control circuit controls data transfer over said ring shift register.

2. The semiconductor chip according to claim 1, wherein said plurality of latch circuits include:
   first latch circuits connected with said first contact pads; and
   second latch circuits connected with said second contact pads,
   wherein said second latch circuits latch output data from said internal circuit, and
   wherein said control circuit is configured to control said first and second latch circuits so that said output data are transferred to said first contact pads through said first latch circuits.

3. The semiconductor chip according to claim 2, further comprising:
   first I/O circuits connected between said first contact pads and said first latch circuits; and
   second I/O circuits connected between said second contact pad and said second latch circuits,
   wherein said second I/O circuits are deactivated when said second latch circuits latch said output data.

4. The semiconductor chip according to claim 1,
   wherein said plurality of contact pads further include third contact pads,
   wherein an area of said third contact pads is larger than that of said second contact pads,
   wherein said plurality of latch circuits further include third latch circuits connected with said third contact pads and latching input data externally provided through said third contact pads, and
   wherein said control circuit is configured to control said first to third latch circuits so that said input data are transferred to said internal circuit.

5. The semiconductor chip according to claim 1, wherein said first and second contact pads are arranged along different edges of said semiconductor chip.

6. The semiconductor chip according to claim 1, wherein said semiconductor chip has first to fourth edges said first and third edges being opposed to each other and said second and fourth edges being opposed to each other,
   wherein said first contact pads are arranged along said first edge, and said second contact pads are arranged along said second edge.

7. The semiconductor chip according to claim 1, wherein said first contact pads have a trace of a probe.

8. The semiconductor chip according to claim 1,
   wherein said plurality of contact pads further include third contact pads,
   wherein said plurality of latch circuits further include third latch circuits latching input data externally provided through said third contact pads,
   wherein an area of said third contact pads is larger than that of said second contact pads,
   wherein said internal circuit is responsive to said input data received by said third latch circuits to output internal circuit output data, and said second latch circuits latch said internal circuit output data, and
   wherein said control circuit controls said first and second latch circuits to transfer said internal circuit output data from said second latch circuits to said first latch circuits.

9. The semiconductor chip according to claim 8, wherein said internal circuit is responsive to said input data received by said third latch circuits to output other internal circuit output data, and said first latch circuits latch said other internal circuit output data, and
   wherein said other internal circuit output data are externally output from said first latch circuits through said first contact pads, and then said internal circuit output data are externally output from said first latch circuits through said first contact pads.

10. The semiconductor chip according to claim 8, wherein said plurality of contact pads further include fourth contact pads, wherein said plurality of latch circuits further include fourth latch circuits connected with said fourth contact pads, wherein an area of said fourth contact pads is smaller than those of said first and third contact pads, wherein said internal circuit is responsive to said input data received by said third latch circuits to output still other internal circuit output data, and said fourth latch circuits latch said other internal circuit output data, wherein said control circuit controls said third and fourth latch circuit to transfer said still other internal circuit output data from said fourth latch circuits to said third latch circuits, and wherein said still other internal circuit output data are externally output from said third latch circuits through said third contact pads.

* * * * *